United States Patent [19]

Tamai et al.

[11] Patent Number: 4,914,292
[45] Date of Patent: Apr. 3, 1990

[54] ION IMPLANTING APPARATUS

[75] Inventors: Tadamoto Tamai, Tokyo; Masateru Sato, Saijo, both of Japan

[73] Assignee: Sumitomo Eaton Nova Corporation, Tokyo, Japan

[21] Appl. No.: 206,055

[22] Filed: Jun. 13, 1988

[30] Foreign Application Priority Data

Jul. 2, 1987 [JP] Japan ................................. 62-163952

[51] Int. Cl.$^4$ ............................................. H05H 3/00
[52] U.S. Cl. ................................. 250/251; 250/492.2
[58] Field of Search ............................ 250/492.21, 251

[56] References Cited

U.S. PATENT DOCUMENTS

| | | | |
|---|---|---|---|
| 3,363,124 | 1/1968 | Bensussam et al. | 250/251 |
| 3,676,672 | 7/1972 | Meckel | 250/290 |
| 4,361,762 | 11/1982 | Douglas | 250/251 |
| 4,463,255 | 7/1984 | Robertson et al. | 250/251 |
| 4,783,597 | 11/1988 | Misawa et al. | 250/251 |

OTHER PUBLICATIONS

Catalog, Sumitomo Eaton Nova, NV-10SD corres. to NV-10-80 and 160 of Eaton, Sen.
Literature, Model 80-10 of Varian, pp. 1-12.
Japanese Catalog, Model 80-10/120-10/160-10 Varian.
Japanese Catalog, Model 80XP/120XP/160XP of Varian.
Literature, Precision Implant 9000 of AMT.

Primary Examiner—Bruce C. Anderson
Attorney, Agent, or Firm—Armstrong, Nikaido, Marmelstein, Kubovcik & Murray

[57] ABSTRACT

In an ion implanting apparatus equipped with an electron shower for neutralizing the positive charge-up by the ion implantation with electrons, an electrically conductive tube is disposed just before the workpiece to be ion-implanted to pass through an ion beam which has a diameter nearly equal to the inner hollow channel of the tube section to absorb those electrons which do not overlap the positive ion beam, and a flange section extends substantially parallel to the surface of the workpiece to absorb the secondary electrons emitted from the ion implant portion thereby suppressing the negative change-up around the ion implanted portion.

8 Claims, 3 Drawing Sheets

ION IMPLANTING APPARATUS

BACKGROUND OF THE INVENTION

1. Field of the Invention

The present invention relates to an apparatus for implanting ions into a workpiece, and more particularly to an ion implanting apparatus equipped with a charge-up suppressing device for suppressing charge-up on a surface of a semiconductor substrate or wafer.

2. Description of the Related Art

In ordinary ion implantation in the semiconductor industries, impurity ions such as boron, phosphorus, and arsenic, are ionized, given high energies, and implanted into semiconductor wafers, thereby doping those impurity atoms. For achieving this doping, impurity ions to be implanted are generated in an ion source, formed into an ion beam, and implanted into semiconductor wafers, while scanning the ion beam relative to the wafers.

In those ion implanting apparatuses which have a large ion current rating, semiconductor wafers are often driven mechanically to achieve the relative scan of the beam on the wafers.

When there are formed, at least partially on the surface of the wafer, insulating members such as oxide films, charge-up of the wafer may be a problem. For example, when a thin insulating layer is formed on a substrate surface and a conducting layer is formed thereon, implanted positive ions may create a positive charge-up on the conducting layer isolated by the insulating layer to generate a high voltage between the conductive layer and the substrate and may destroy the insulating layer disposed therebetween. Such destruction of the insulating layer will destroy the circuit pattern of the semiconductor circuit and lower the yield in the LSI manufacture.

It has been proposed to provide an electron shower in the vicinity of the wafer to supply electrons to the wafers being implanted with positive ions and thereby neutralizing the charge-up on the wafer surface. There are two types of neutralizing the charge-up by electron shower; one being directly flooding by electrons generated by an electron shower to the wafer surface, and the other being deflecting and guiding the electrons by the electrostatic potential formed by the ion beam to thereby supply the electrons to the wafer surface.

According to the former method of directing the electrons generated by an electron shower directly onto the wafer surface, the electrons will be distributed widely on the wafer surface. Thus, a significant amount of electrons may also be supplied on those areas where the ion beam is not irradiated. A large negative charge can thus be created thereat to cause dielectric breakdown of the insulating film. According to the latter method of deflecting electrons by the electrostatic field formed by the ion beam and thereby guiding the electrons onto the very area of the wafer surface where the ion beam is being irradiated, the electrons cannot be effectively guided onto the wafer surface unless the wafer surface is charged above a certain degree, so it is not easy to reduce the charge-up voltage on the wafer surface below a certain value.

Also, since the ion beam is irradiated on the wafer and the wafer disk mechanically scanning the wafers, many secondary electrons are caused to be emitted from the irradiated grounded conducting areas which then flood on the wafer surface and create large negative charge-up in wide areas around the irradiated portion and may cause destruction of the insulating films on the wafer surface.

SUMMARY OF THE INVENTION

An object of the present invention is to provide an ion implanting apparatus which can effectively neutralize the charge-up formed by the positive ions with electrons and also prevent excessive charging by electrons.

According to an aspect of the invention, there is provided an ion implanting apparatus of high current type comprising a conductive tube surrounding an ion beam which irradiates a wafer and having an inner diameter somewhat larger than the cross-section of the ion beam with its opening disposed close to the wafer surface, and an electron shower disposed in the conductive tube. The electron shower may comprise an electron gun an a metal target.

Due to the provision of the conductive tube, electrons generated from the electron shower can be prevented from being separated from the ion beam and be effectively guided onto the region where the ion beam is irradiated, suppressing the positive and the negative charge-up on the wafer surface. Further, the distance between the electron shower and the wafer can be short. Even a small amount of charge-up on a wafer surface can be controlled. Destruction of the insulating films on the wafer surface can be prevented by the effective charge neutralization.

DESCRIPTION OF THE PREFERRED EMBODIMENTS

Figure 1:
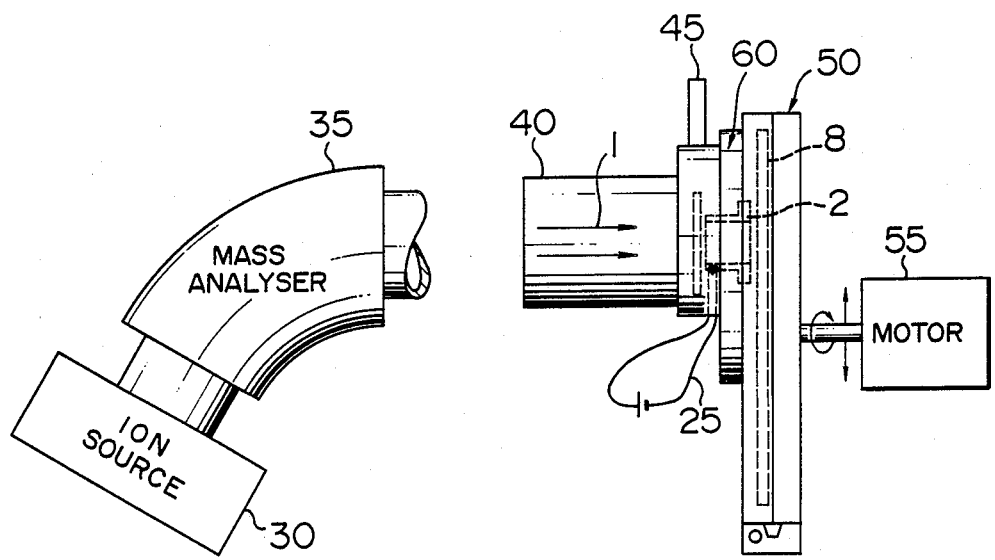
FIG. 1 is a schematic diagram of an ion implanting apparatus according to an embodiment of the present invention.

An ion implanting apparatus according to an embodiment of the invention will be described referring to the accompanying drawings. FIG. 1 shows a framework of the total apparatus. The apparatus is of a so-called high current type which has a maximum ion current of above about 2 mA, for example around 10 mA. Those ion implanting apparatuses which are known as the high current type include NV-10-80 and 160 of EATON, SEN, 80-10, 120-10, and 160-10 of Varian, PRECISION IMPLANT 9000 of AMT, etc. Those matters of general knowledge which are known from the catalogues and manuals of these apparatuses are incorporated herein by reference. In FIG. 1, ions derived from the ion source 30 are mass-analyzed in a mass analyser section 35 to form an ion beam 1, in a vacuum chamber system. An ion beam introducing channel 40 is selectively and hermetically connected to an ion implanting chamber 50 through a gate valve 45. In the ion implanting chamber 50, a disk 8 carrying a multiplicity of wafers is revolved by a motor 55. In front of the disk 8, there is provided a charge neutralizing unit 60 which includes an electron shower 25 and a tube 2. The details of this charge neutralizing unit 60 are shown in FIGS. 2 and 3.

Figure 2:
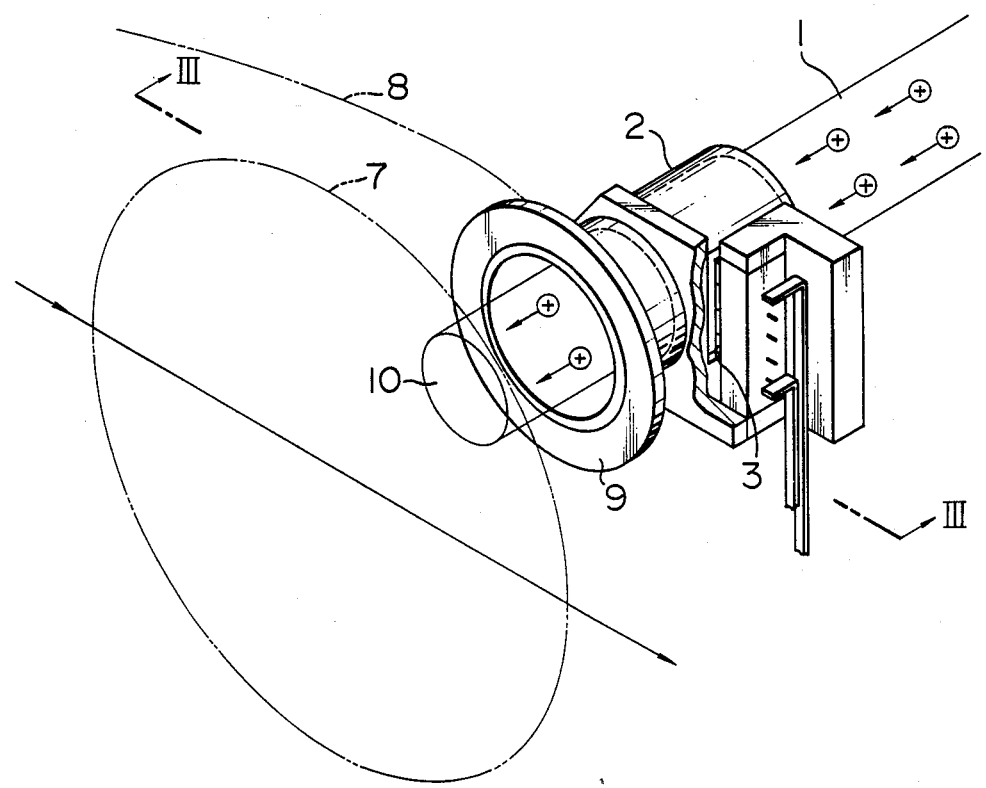
FIG. 2 is a partial perspective view of a main part in the ion implanting chamber in the apparatus of FIG. 1.
Figure 3:
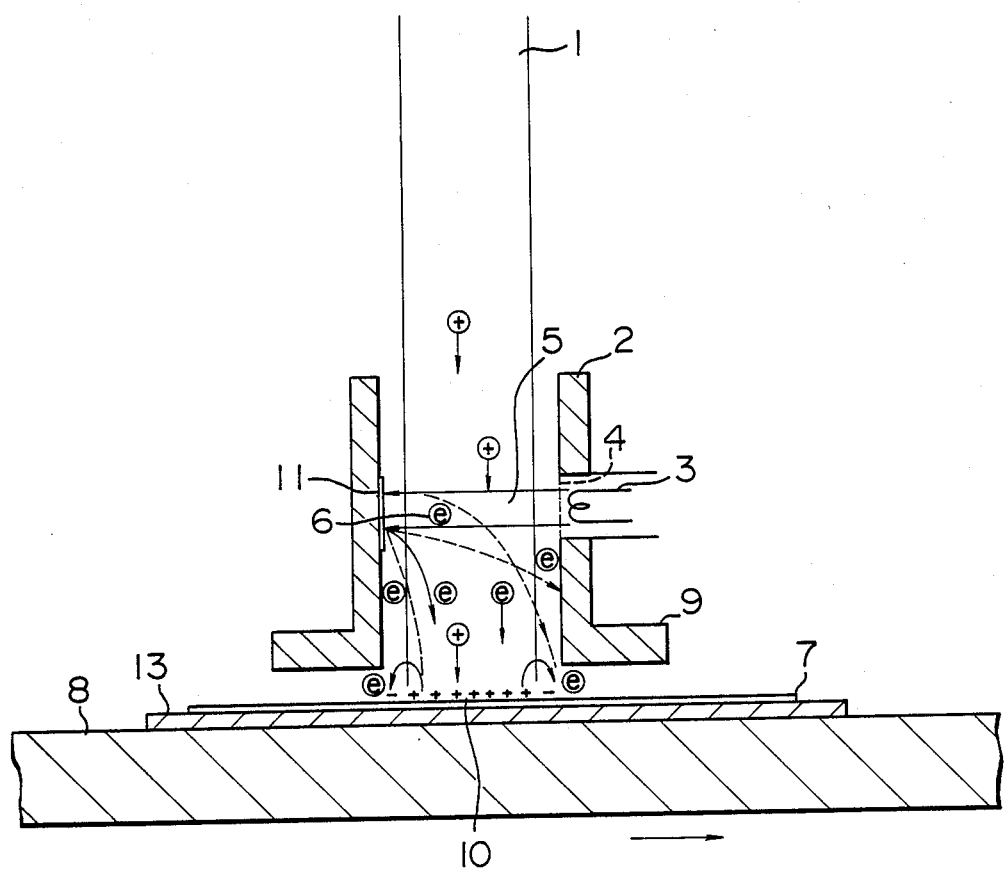
FIG. 3 is a cross-section along line III—III in FIG. 2.

In FIGS. 2 and 3, the ion beam 1 generated in the ion source section and analyzed in the analyzer section is irradiated on a wafer 7 carried on the disk 8 which performs a mechanical scanning. The conductive tube 2 is supported by and isolated from the chamber wall and surrounds the ion beam 1. The tube 2 may be formed of an electrically conducting material such as aluminum and is shaped to have a beam transmitting channel of e.g. circular or elliptic cross-sectional shape, which is a little larger than the outer shape of the ion beam 1 and of such dimensions that the tube does not interfere the ion beam. For example, when the ion beam has a diameter of 40–50 mm, the tube has an inner diameter larger than that of the ion beam by about 5 mm. The tube 2 is formed into a nozzle shape with its opening set in the vicinity of a wafer 7. At this opening, a flange 9 is connected to extend from the opening substantially in parallel with the surface of the wafer 7. The flange 9 is best positioned as close as possible to the surface of the wafer provided that it is mechanically tolerable. In the present example, the distance between the flange 9 and the wafer surface is set at 10–20 mm from the mechanical limitations, which was approved to be sufficiently effective. The larger the outer diameter or dimension of the flange is, the better. In the present example, the outer diameter of the flange was selected to be two or three times as large as the beam diameter of the ion beam 1, which was approved to be sufficiently effective. This flange 9 works to suppress the outward spreading of secondary electrons 6 generated from the wafer surface etc. which is being irradiated by the ion beam 1.

A filament 3 is made for example of tungsten W and can emit thermal electrons when heated to a high temperature by allowing a current to flow therethrough. Those generated thermal electrons are pulled by the voltage of several hundreds volts applied between the filament 3 and the grid 4 disposed in front of the filament 3, to form a primary electron beam 5. Namely, the filament 3 and the grid 4 constitute an electron gun. The electron gun is positioned at the inner surface of the tube 2 and is directed toward a target 11 disposed on the opposite side of the inner wall of the tube 2. The primary electron beam 5 impinges on the target 11 to cause emission of secondary electrons 6 from the target 11. The target 11 may be formed of any material which can emit electrons when being irradiated by an electron beam. For example, the target 11 is made of aluminum and may be formed of part of the inner surface of the tube 2. The relative position of the target 11 and the wafer 7 is so selected that the secondary electrons will not directly impinge the wafer 7. The assembly of the electron gun and the target constitutes an electron shower.

Among the secondary electrons directed toward the opposing inner tube surface, high kinetic energy electrons will impinge the opposing inner surface and be annihilated thereat. Those secondary electrons which have low kinetic energies will be captured by the electrostatic field which is dominated by the tube 2, the disk 8, and the ion beam 1, and be guided onto the wafer 7 in the irradiated area.

The above-mentioned structure provides the following functions. The thermal electrons generated from the filament 3 of the electron shower are accelerated by the grid 4 to form the primary electron beam 5, which impinges the target 11 to generate secondary electrons 6. Among these secondary electrons 6, those having higher energies will not be captured by the electrostatic potential, they will impinge on the opposing surface and be absorbed thereat. Those having low kinetic energies will be captured by the electrostatic potential dominated by the ion beam 1, the tube 2, and the wafer disk 8, and be distributed in the cross section of the beam and in the vicinity thereof. Since the tube 2 surrounds the ion beam 1 and extends to the vicinity of the wafer 7 in a nozzle shape, the secondary electrons will be effectively carried to only the portion of the wafer 7 where the ion beam 1 is being irradiated. The tube 2 prevents the secondary electrons 6 from reaching those portions of the wafer where no ion beam is irradiated, so that the secondary electrons would hardly establish a high negative charge-up. When the beam irradiated portion 10 on the wafer 7 is positively charged up, a strong electric field will be established between the beam irradiated portion 10 and the tube 2 extending close to the wafer 7 and those electrons distributed in the cross-section of the ion beam 1 and the vicinity thereof will neutralize this charge. When the ion beam is irradiated on the grounded wafer disk 8 and there is no particular charge-up in the wafer portion, the secondary electrons 6 generated from the ion irradiated portion 10 will be stored in the tube 2, which can be re-emitted to when a positive charge-up is established on the wafer 7, etc. to neutralize the charge-up. In FIG. 3, numeral 13 denotes a wafer susceptor.

Now the function of the flange 9 will be described. When the ion beam 1 is irradiated on the wafer 7, the wafer disk 8, etc., a lot of secondary electrons 6 may be generated. When there is no flange 9, the secondary electrons scattering from the irradiated portion 10 will be widely spread from the irradiated portion 10 to cause positive charge-up of the beam-irradiated portion 10 and negative charge-up of the non-beam-irradiated portions which can extend far into the peripheral portion. Due to the existence of the flange 9, those electrons which would otherwise be spread widely to the surrounding portion will collide with the flange 9 and be annihilated thereat. Thus, as shown in FIG. 3, there will be almost no spreading of the secondary electrons 6 and hence no negative charge-up on the wafer surface. Further when the wafer 7 is charged up, the closely disposed flange 9 will generate an intense electric field therebetween which will repel strongly the secondary electrons 6 emitted from the wafer 7 back to the wafer 7 and thus suppress the charge-up.

We claim:
1. An ion implanting apparatus for implanting ions into a workpiece, comprising:
   (a) a vacuum chamber for forming an evacuated space;
   (b) support means for supporting a workpiece in the vacuum chamber;
   (c) means for generating and accelerating an ion beam, and ion introducing channel means for directing the ion beam onto the workpiece;
   (d) an electrically conducting member having an open internal space and surrounding the ion beam in the vacuum chamber and having an open end extending to a position close to a surface of the workpiece; and
   (e) an electron shower for supplying electrons to the space in said conducting member.
2. An ion implanting apparatus according to claim 1, wherein said conducting member is a metal cylinder.
3. An ion implanting apparatus according to claim 2, wherein said metal is aluminum.
4. An ion implanting apparatus according to claim 1, wherein said electrically conducting member includes a tube section surrounding the ion beam and a flange section extending radially outward from an open end of the tube is close to and faces the surface of the workpiece.

5. An ion implanting apparatus according to claim 4, wherein the electron shower includes a metal target disposed on an inner surface of the tube section and an electron gun for impinging electrons on the metal target.

6. An ion implanting apparatus according to claim 4, wherein said tube section and said flange section are made of metal, the tube section has an inner diameter slightly larger than the diameter of the ion beam, and the flange section has an outer diameter significantly larger than the diameter of the ion beam.

7. An ion implanting apparatus according to claim 4, wherein the tube section has an inner diameter that is larger than a diameter of the ion beam by not more than 10 mm, and the flange section is spaced from the surface of the workpiece by not more than 20 mm and has a radially outer diameter at least equal to about twice the diameter of the ion beam.

8. An ion implanting apparatus of a high current type equipped with a charge-up suppressing unit comprising: an ion introducing channel means, an electron shower including an electron gun and an electrically conducting target, an electrically conducting tube section positioned to surround an ion beam directed to irradiate a workpiece and having an internal opening slightly larger than a cross section of the ion beam, and the electron shower is disposed in the electrically conducting tube section.

* * * * *